United States Patent
Huang et al.

(10) Patent No.: US 9,117,589 B2
(45) Date of Patent: Aug. 25, 2015

(54) CAPACITOR STRUCTURE AND STACK-TYPE CAPACITOR STRUCTURE

(71) Applicant: Formosa Epitaxy Incorporation, Taoyuan County (TW)

(72) Inventors: Chih-Shu Huang, Taoyuan County (TW); Shyi-Ming Pan, Taoyuan County (TW); Wei-Kang Cheng, Taoyuan County (TW)

(73) Assignee: Formosa Epitaxy Incorporation, Taoyuan (TW)

( * ) Notice: Subject to any disclaimer, the term of this patent is extended or adjusted under 35 U.S.C. 154(b) by 0 days.

(21) Appl. No.: 14/156,478

(22) Filed: Jan. 16, 2014

(65) Prior Publication Data

US 2015/0069573 A1  Mar. 12, 2015

(30) Foreign Application Priority Data

Sep. 12, 2013  (TW) .............................. 102133050 A

(51) Int. Cl.

| | |
|---|---|
| H01L 21/20 | (2006.01) |
| H01L 27/108 | (2006.01) |
| H01G 2/00 | (2006.01) |
| H01L 23/64 | (2006.01) |
| H01L 29/66 | (2006.01) |
| H01L 27/08 | (2006.01) |
| H01L 29/94 | (2006.01) |

(52) U.S. Cl.
CPC ................ *H01G 2/00* (2013.01); *H01L 23/642* (2013.01); *H01L 27/0805* (2013.01); *H01L 29/66181* (2013.01); *H01L 29/94* (2013.01)

(58) Field of Classification Search
CPC ............ H01L 23/642; H01L 29/66181; H01L 27/0805; H01L 29/94
USPC .......................................... 257/303; 438/396
See application file for complete search history.

(56) References Cited

U.S. PATENT DOCUMENTS

| | | | |
|---|---|---|---|
| 6,078,492 A * | 6/2000 | Huang et al. ................ | 361/301.4 |
| 2003/0072129 A1* | 4/2003 | Kuwako et al. ............... | 361/525 |
| 2004/0161593 A1* | 8/2004 | Yamazaki et al. ............ | 428/209 |
| 2006/0008926 A1* | 1/2006 | Torek et al. ........................ | 438/1 |
| 2010/0002362 A1* | 1/2010 | Clelland et al. ............... | 361/502 |
| 2011/0170233 A1* | 7/2011 | Lee et al. ....................... | 361/502 |

* cited by examiner

*Primary Examiner* — Nicholas Tobergte
(74) *Attorney, Agent, or Firm* — Jianq Chyun IP Office

(57) ABSTRACT

A capacitor structure is provided, which includes a conductive substrate, a first dielectric layer, and a first metal layer. The conductive substrate includes a first surface and at least one first concave located on the first surface. The first dielectric layer covers the first surface and the first concave. The first metal layer covers the first dielectric layer, wherein the first dielectric layer and the first metal layer respectively have concave structures corresponding to the first concave. A stack-type capacitor structure is also provided.

19 Claims, 4 Drawing Sheets

CAPACITOR STRUCTURE AND STACK-TYPE CAPACITOR STRUCTURE

CROSS-REFERENCE TO RELATED APPLICATION

This application claims the priority benefit of Taiwan application serial no. 102133050, filed on Sep. 12, 2013. The entirety of the above-mentioned patent application is hereby incorporated by reference herein and made a part of this specification.

BACKGROUND OF THE INVENTION

1. Field of the Invention

The invention relates to a semiconductor device and a stack-type semiconductor device, and particularly relates to a capacitor structure and a stack-type capacitor structure.

2. Description of Related Art

As the advance of technology, application of semiconductor devices, such as computers, communication or consumer electronic products, becomes more and more extensive, and requires a large number of semiconductor devices that provide different functions. In the semiconductor devices, capacitor is an essential and important element. In terms of the electric circuit, a capacitor may be used and disposed near the load to stabilize the loading voltage. Therefore, the ideal biasing of a circuit module of an integrated circuit is to dispose a capacitor in connection of an operation voltage terminal and a ground terminal.

As the degree of integration of the semiconductor device increases, however, the size of the device is gradually reduced, and the available chip area for the plate of the capacitor is consequently reduced. In other words, as the size of the chip decreases, it is harder and harder to use a capacitor comprising plate occupied large area. And as a result, the capacitance of the capacitor is relatively reduced, and the decrease of the capacitance may cause errors for storage data. Hence, how to fabricate a high-integration capacitor structure having high-capacitance by the current integrated circuit fabrication process to improve performance of the capacitor has now become an important issue in the field of integrated circuit design.

BRIEF SUMMARY OF THE INVENTION

The invention provides a capacitor structure and a stack-type capacitor structure having high integration and high capacitance.

The capacitor structure of the invention includes a conductive substrate, a first dielectric layer, and a first metal layer. The conductive substrate includes a first surface and at least one first concave located on the first surface. The first dielectric layer covers the first surface and the first concave. The first metal layer covers the first dielectric layer, wherein the first dielectric layer and the first metal layer respectively have concave structures corresponding to the first concave.

The stack-type capacitor structure of the invention includes at least two capacitor structures, as described above, wherein the capacitor structures are stacked and electrically connected in parallel with each other, and at least one cavity exists between any two adjacent capacitor structures.

In an embodiment of the invention, the number of the first concave of the capacitor structure may be two or more.

In an embodiment of the invention, the capacitor structure may further include a second dielectric layer and a second metal layer. The conductive substrate may include a second surface opposite to the first surface and at least one second concave located on the second surface. The second dielectric layer covers the second surface and the second concave. The second metal layer covers the second dielectric layer, wherein the second dielectric layer and the second metal layer respectively have concave structures corresponding to the second concave.

In an embodiment of the invention, the first concave may be substantially aligned with the second concave.

In an embodiment of the invention, the first concave may not be substantially aligned with the second concave.

In an embodiment of the invention, a material of the conductive substrate may include a semiconductor material.

In an embodiment of the invention, a length of the stack-type capacitor structure in a longitudinal direction of the conductive substrate may substantially range from 0.1 cm to 1.5 cm.

In an embodiment of the invention, a length of the stack-type capacitor structure in a transverse direction of the conductive substrate may substantially range from 0.1 cm to 1.5 cm.

In an embodiment of the invention, the stack-type capacitor structure may further include a first connection element and a second connection element. The conductive substrate and the first metal layer of the capacitor structure are electrically connected with the first connection element and the second connection element respectively.

In an embodiment of the invention, the stack-type capacitor structure may further include a first connection element and a second connection element, wherein the conductive substrates of any two adjacent capacitor structures are electrically connected with the first connection element and the second connection element respectively.

In an embodiment of the invention, a material of the first connection element and the second connection element of the stack-type capacitor structure may include a metal or a semiconductor.

In an embodiment of the invention, the stack-type capacitor structure may comprise a plurality of the capacitor structures and at least one of the capacitor structures may further include a second dielectric layer and a second metal layer. And a conductive substrate includes a second surface opposite to the first surface and at least one second concave located on the second surface. The second dielectric layer covers the second surface and the second concave. The second metal layer covers the second dielectric layer, wherein the second dielectric layer and the second metal layer respectively have concave structures corresponding to the second concave.

In an embodiment of the invention, the first concave and second concave of the capacitor structure may be substantially aligned with each other.

In an embodiment of the invention, the first concave and second concave of the capacitor structure may not be substantially aligned with each other.

In an embodiment of the invention, the stack-type capacitor structure may further include a first connection element and a second connection element. One of the conductive substrates is electrically connected with the first connection element, and the corresponding first metal layer and/or second metal layer are electrically connected with the second connection element.

According to the invention briefly summarized above, the conductive substrate and the metal layer of the capacitor structure of the invention have multiple corresponding concaves to obtain a larger surface area to generate a greater capacitance. Because the capacitance of the capacitor structure is increased, the size of the capacitor structure can be reduced accordingly. Therefore, the capacitor structure of the invention not only provides a higher capacitance but also has higher integration. In addition, the invention further provides a stack-type capacitor structure comprising at least two capacitor structures which have multiple corresponding concaves and electrically connect in parallel with each other, so as to accumulate the capacitance of the capacitor structures to further increase the integration and capacitance of the stack-type capacitor structure and to improve the performance of the stack-type capacitor structure.

DETAILED DESCRIPTION OF THE INVENTION

Figure 1:
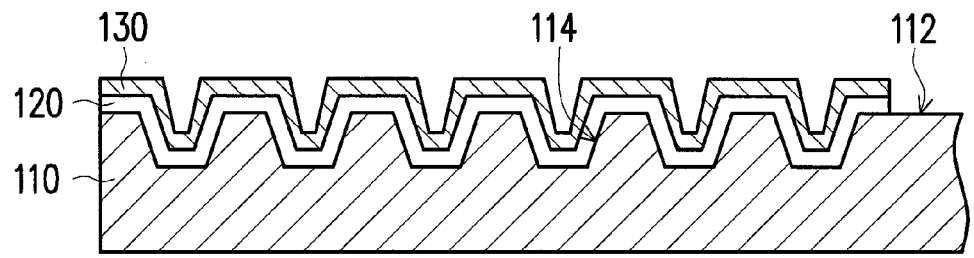
FIG. 1 is a schematic cross-sectional view of a capacitor structure according to an embodiment of the invention.

As shown in FIG. 1, a capacitor structure 100 according to an embodiment of the invention includes a conductive substrate 110, a first dielectric layer 120, and a first metal layer 130. The conductive substrate 110 has a first surface 112 and at least one first concave 114 located on the first surface 112. According to the embodiment, the number of the first concaves 114 may be two or more, and the open (or top) area of the first concave 114 may be not smaller than the bottom area of the first concave 114. In addition, the first concave 114 may shape like pyramid, cone, or groove. The first dielectric layer 120 covers the first surface 112 and the first concave 114. The first metal layer 130 covers the first dielectric layer 120, wherein the first dielectric layer 120 and the first metal layer 130 respectively have concave structures corresponding to the first concave 114, as shown in FIG. 1. In other words, the first dielectric layer 120 and the first metal layer 130 may respectively cover the conductive substrate 110 conformally. A material of the conductive substrate 110 may include metal material, semiconductor material such as silicon or silicon carbide, or III-V group or II-VI group compound semiconductor such as arsenic nitride, phosphorus nitride, and gallium nitride, etc. According to the embodiment, the conductive substrate 110 is, for example, a low-resistance silicon substrate; however, it should be noted that the invention is not limited thereto. In other embodiments, which may refer to FIGS. 7 and 8, the conductive substrate 110 may further include at least one conductive layer 190 that covers the first surface 112 and the first concave 114 conformally, and the first dielectric layer 120 is located between the conductive layer 190 and the corresponding first metal layer 130. Because the capacitance may still be generated between a conductive layer 190 of the conductive substrate 110 and a first metal layer 130 when driving, the material of a conductive substrate 110 according to the embodiments may comprise general silicon substrate or other suitable substrate which is cheaper than low-resistance silicon substrate or metal substrate, and the production cost of the embodiments may be further reduced according to the invention.

Figure 2:
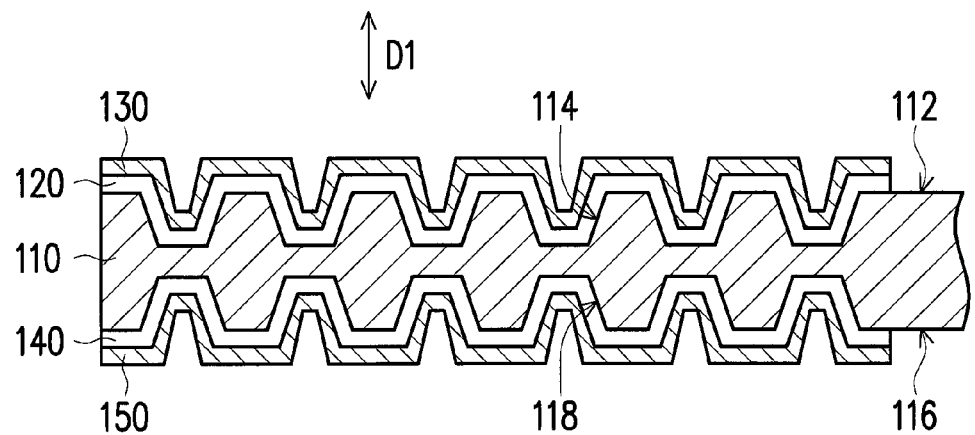
FIG. 2 is a schematic cross-sectional view of a capacitor structure according to another embodiment of the invention.

As shown in FIG. 2, a capacitor structure 100a according to an embodiment of the invention, which is similar to the capacitor structure 100 of FIG. 1, may further include a second dielectric layer 140 and a second metal layer 150. The conductive substrate 110 may further include a second surface 116 opposite to the first surface 112 and at least one second concave 118 located on the second surface 116. The second dielectric layer 140 covers the second surface 116 and the second concave 118, and the second metal layer 150 covers the second dielectric layer 140, wherein the second dielectric layer 140 and the second metal layer 150 respectively have concave structures corresponding to the second concave 118, as shown in FIG. 2. In other words, the second dielectric layer 140 and the second metal layer 150 may respectively cover the conductive substrate 110 conformally.

According to the embodiment, the top area of the second concave 118 may be not smaller than the bottom area of a second concave 118. Moreover, the first concave 114 may be substantially aligned with the second concave 118. In addition, the second concave 118 may shape like pyramid, cone, or groove. The first concave 114 may be substantially aligned with the second concave 118 in a thickness direction D1 of the conductive substrate 110. In other embodiments of the invention, the first concave 114 may not be substantially aligned with the second concave 118, for example the first concave 114 and the second concave 118 may be arranged alternately. The number of the second concaves 118 may be equal or not equal to the number of the first concaves 114.

According to the embodiments described above and shown in FIGS. 1 and 2, because the capacitor structure 100 (100a) comprises the conductive substrate 110 and the metal layer 130 (150) having multiple and corresponding concaves, a larger surface area is obtained to generate a greater capacitance. Furthermore, because the capacitance per unit of the capacitor structure 100 (100a) is increased, the size of the capacitor structure 100 (100a) can be reduced, and chip areas occupied by the capacitor structure 100 (100a) are also reduced consequently.

Figure 3:
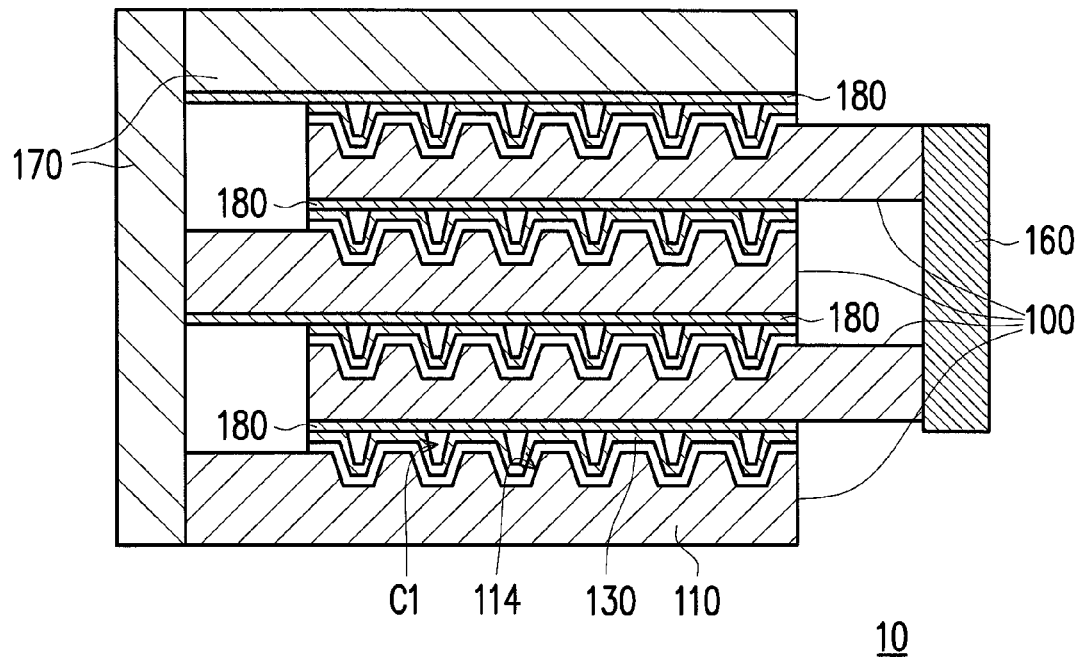
FIG. 3 to FIG. 8 are schematic cross-sectional views of stack-type capacitor structures according to different embodiments of the invention.

As shown in FIG. 3, a stack-type capacitor structure 10 according to an embodiment of the invention includes at least two capacitor structures 100 shown in FIG. 1. The capacitor structures 100 may be stacked and electrically connected in parallel with each other, wherein at least one cavity C1 exists between any two adjacent capacitor structures 100. The cavity C1 is formed and surrounded by the concave on one capacitor structure 100 and the adjacent structure, such as another capacitor structure 100 or a connection element 170, etc., and the number of the cavities C1 may correspond to the number of the first concaves 114. Thus, the capacitance of this stack-type capacitor structure 10 is substantially equal to a total of the capacitance of the capacitor structures 10 through parallel connection of these capacitor structures 100. Therefore, the stack-type capacitor structure 10 of this embodiment has higher integration and provides higher capacitance.

According to the embodiment, the stack-type capacitor structure 10 may further include a first connection element 160 and a second connection element 170, and the conductive substrate 110 and the first metal layer 130 of the capacitor structure 100 are electrically connected with the first connection element 160 and the second connection element 170 respectively. The material of the first connection element 160 and the second connection element 170 may include a metal or a semiconductor. More specifically, the conductive substrates 110 of any two adjacent capacitor structures 100 are electrically connected with the first connection element 160 and the second connection element 170 respectively. Moreover, the conductive substrate 110 and the first metal layer 130 of the capacitor structure 100 are electrically connected with different connection elements 160 and 170 respectively, thereby forming a parallel connection structure shown in FIG. 3. It should be noted that this embodiment is given as an example of the invention, and this disclosure of the invention is not intended to limit the number of the capacitor structures of the stack-type capacitor structure 10 and the parallel connection method thereof. Any stack-type capacitor structure with capacitor structures electrically connected in parallel to accumulate the capacitance falls within the scope of the invention.

Further to the above, according to the embodiment, the stack-type capacitor structure 10 may further include a plurality of first conductive layers 180, wherein the first conductive layers 180 are respectively disposed on surfaces that are in contact with the first metal layers 130 of the conductive substrates 110. For example, as shown in FIG. 3, the first conductive layer 180 may be disposed on the surface of the second connection element 170 or the conductive substrate 110, which is correspondingly in contact with the first metal layer 130 of the conductive substrate 110. Such that the first metal layers 130, the second connection elements 170 and the conductive substrates 110 are bonded correspondingly to form electrical connection.

Figure 4:
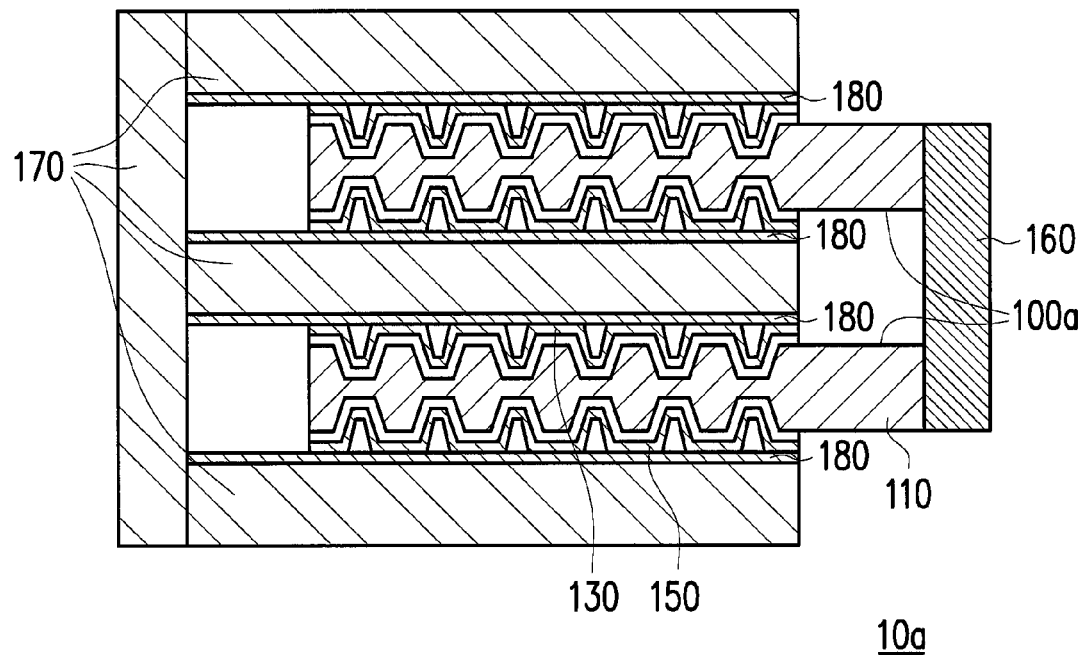

As shown in FIG. 4, a stack-type capacitor structure 10a according to an embodiment of the invention may include at least two capacitor structures 100a shown in FIG. 2, wherein the capacitor structures 100a are stacked and electrically connected in parallel with each other. As described above, the capacitor substrate 100a further includes the second dielectric layer 140 and the second metal layer 150. The conductive substrate 110 includes at least one second concave 118 located on the second surface 116. The second dielectric layer 140 covers the second surface 116 and the second concave 118, and the second metal layer 150 covers the second dielectric layer 140. The second dielectric layer 140 and the second metal layer 150 respectively have concave structures corresponding to the second concave 118, so that at least one cavity exists between any two adjacent capacitor structures 100a. Thus, the capacitance of the stack-type capacitor structure 10a is increased by accumulating the capacitance of the capacitor structures 100a through parallel connection of the capacitor structures 100a.

According to the embodiment, the stack-type capacitor structure 10a may further include a first connection element 160 and a second connection element 170. At least one of the conductive substrates 110 is electrically connected with the first connection element 160, and the corresponding first metal layer 130 and second metal layer 150 are electrically connected with the second connection element 170. More specifically, the conductive substrates 110 may all be electrically connected with the first connection element 160, and the corresponding first metal layers 130 and second metal layers 150 may all be electrically connected with the second connection element 170, for example, so as to form a parallel connection structure shown in FIG. 4. It should be noted that this embodiment is given as an example of the invention. This disclosure of the invention is not intended to limit the number of the capacitor structures of the stack-type capacitor structure 10a and the parallel connection method thereof.

Additionally, according to the embodiment, the stack-type capacitor structure 10a may further include a plurality of first conductive layers 180, wherein the first conductive layers 180 are respectively disposed on surfaces that are in contact with the first metal layer 130 and the second metal layer 150 of the conductive substrate 110. For example, as shown in FIG. 4, the first conductive layers 180 may be respectively disposed on the surface of the second connection element 170, which is in contact with the first metal layer 130 and the second metal layer 150, such that the first metal layer 130 and the second metal layer 150 are bonded to the corresponding second connection element 170 to form electrical connection.

Figure 5:
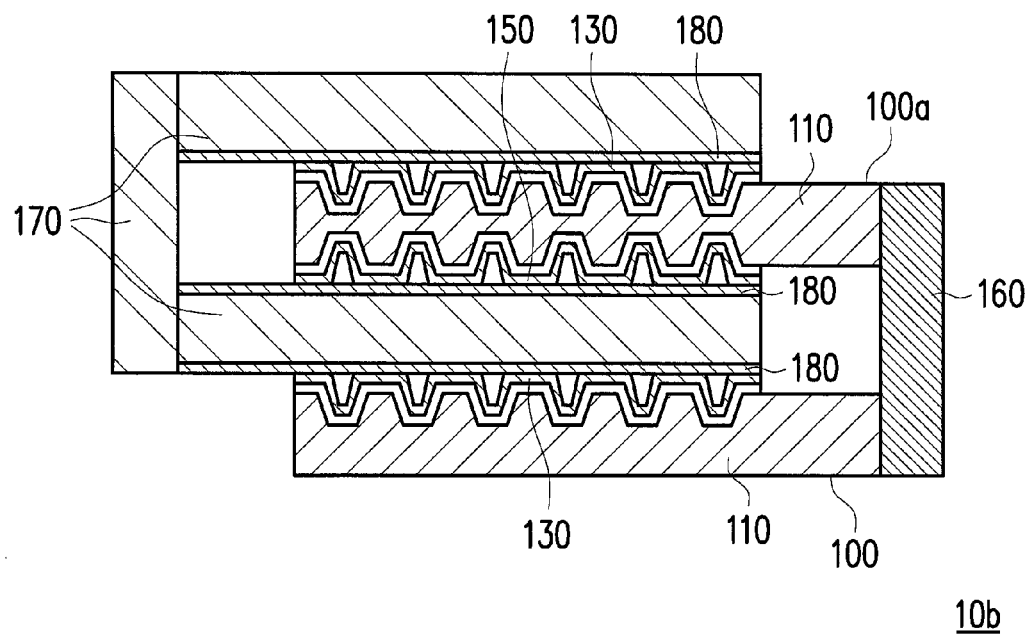

As shown in FIG. 5, a stack-type capacitor structure 10b according to an embodiment of the invention may include at least two capacitor structures which are stacked and electrically connected in parallel with each other, wherein at least a part of the capacitor structures is the capacitor structure 100a of FIG. 2. In other words, at least a part of the capacitor structures of the stack-type capacitor substrate 10b further includes the second dielectric layer 140 and the second metal layer 150, and at least one of related conductive substrates 110 further includes at least one second concave 118 located on the second surface 116. The second dielectric layer 140 covers the second surface 116 and the second concave 118, and the second metal layer 150 covers the second dielectric layer 140. The second dielectric layer 140 and the second metal layer 150 respectively have concave structures corresponding to the second concave 118. For example, the stack-type capacitor structure 10b may be formed by stacking and electrically connecting in parallel at least one capacitor structure 100 and at least one capacitor structure 100a.

According to the embodiment, the first concave 114 of the capacitor structure 100a that includes the second concave 118 is substantially aligned with the second concave 118. It should be noted that, in other embodiments of the invention, the first concave 114 of the capacitor structure 100a that includes the second concave 118 may not be substantially aligned with the second concave 118. For example, the first concave 114 and the second concave 118 of the capacitor structure 100a of the stack-type capacitor structure 10b may be arranged alternately. The number of the second concaves 118 may be equal or not equal to the number of the first concaves 114.

According to the embodiment, the stack-type capacitor structure 10b may further include a first connection element 160 and a second connection element 170, wherein at least one of the conductive substrates 110 is electrically connected with the first connection element 160, and the corresponding first metal layer 130 and/or second metal layer 150 are electrically connected with the second connection element 170. More specifically, the conductive substrates 110 may all be electrically connected with the first connection element 160, and the corresponding first metal layers 130 and/or second metal layers 150 may all be electrically connected with the second connection element 170, for example, so as to form a parallel connection structure shown in FIG. 5. It should be noted that this embodiment is given as an example of the invention. This disclosure of the invention is not intended to limit the number of the capacitor structures of the stack-type capacitor structure 10b and the parallel connection method thereof.

Additionally, according to the embodiment, the stack-type capacitor structure 10b may further include a plurality of first conductive layers 180, wherein the first conductive layers 180 are respectively disposed on surfaces that are in contact with the first metal layer 130 and the second metal layer 150 of the conductive substrate 110. For example, as shown in FIG. 5, the first conductive layers 180 may be respectively disposed on the surface of the second connection element 170, which is in contact with the first metal layer 130 and the second metal layer 150, such that the first metal layer 130 and the second metal layer 150 are bonded to the corresponding second connection element 170 to form electrical connection. Thus, the stack-type capacitor structure 10b has higher integration and higher capacitance by accumulating the capacitance of the capacitor structures 100 and 100a through parallel connection of the capacitor structures 100 and 100a.

Figure 6:
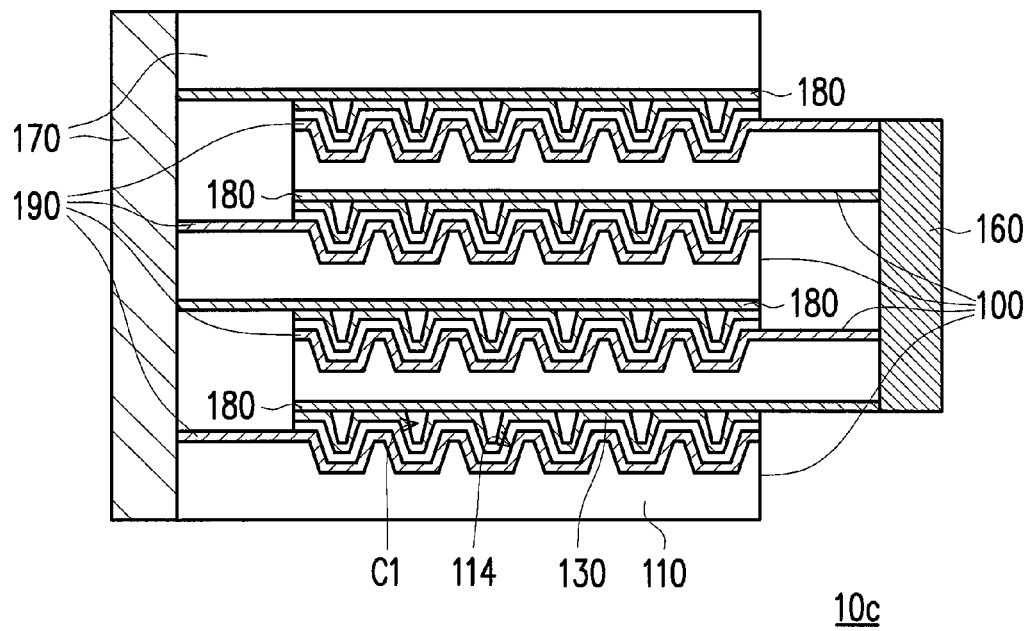

As shown in FIG. 6, a stack-type capacitor structure 10c according to an embodiment of the invention, which is similar to the stack-type capacitor structure 10 of FIG. 3, further includes at least one second conductive layer 190 of the conductive substrate 110. According to the embodiment, the conductive substrate 110 includes the second conductive layer 190 that conformally covers the first surface 112 and the first concave 114 of the conductive substrate 110, and is located between the conductive substrate 110 and the corresponding first dielectric layer 120. Moreover, the second conductive layer 190 and the first metal layer 130 of the conductive substrate 110 are electrically connected with the first connection element 160 and the second connection element 170 respectively. Accordingly, the capacitance may still be generated between a conductive layer 190 of the conductive substrate 110 and a first metal layer 130, which are electrically connected with the corresponding connection elements 160/170. Therefore, the material of a conductive substrate 110 according to the embodiments may comprise general silicon substrate or other suitable substrate which is cheaper than low-resistance silicon substrate or metal substrate, and the production cost of the embodiments may be further reduced according to the invention.

Figure 7:
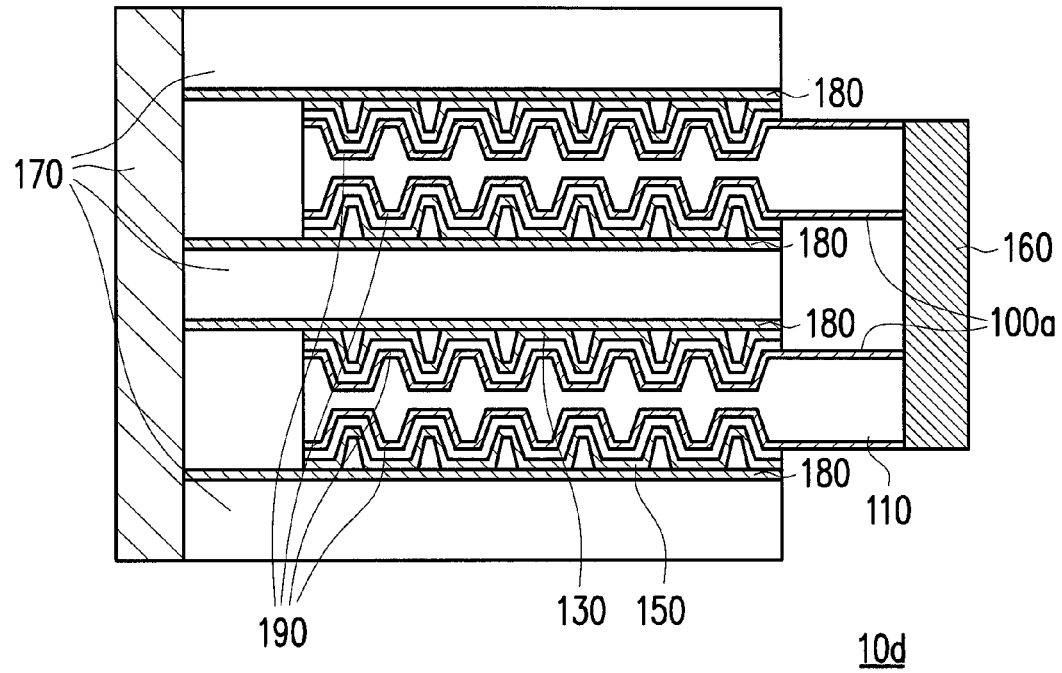

As shown in FIG. 7, a stack-type capacitor structure 10d according to an embodiment of the invention, which is similar to the stack-type capacitor structure 10a of FIG. 4, further includes at least one second conductive layer 190 of the conductive substrate 110. According to the embodiment, the conductive substrate 110 includes two second conductive layers 190 that respectively cover the first surface 112 and the second surface 116 of the conductive substrate 110 and the corresponding first concave 114 and second concave 118 conformally. In addition, the second conductive layers 190 are respectively located between the conductive substrate 110 and the corresponding dielectric layers 120 and 140, and the second conductive layers 190 of the conductive substrate 110 and the corresponding metal layers 130 and 150 are respectively connected with different connection elements. For example, as shown in FIG. 7, the second conductive layers 190 of the conductive substrate 110 are electrically connected with the first connection element 160, and the corresponding first metal layer 130 and second metal layer 150 are electrically connected with the second connection element 170 respectively. Accordingly, the capacitance may still be generated between a conductive layers 190 of the conductive substrate 110 and the corresponding metal layers 130/150, which are electrically connected with the corresponding connection elements 160/170. Therefore, the material of a conductive substrate 110 according to the embodiments may comprise general silicon substrate or other suitable substrate which is cheaper than low-resistance silicon substrate or metal substrate, and the production cost of the embodiments may be further reduced according to the invention.

Figure 8:
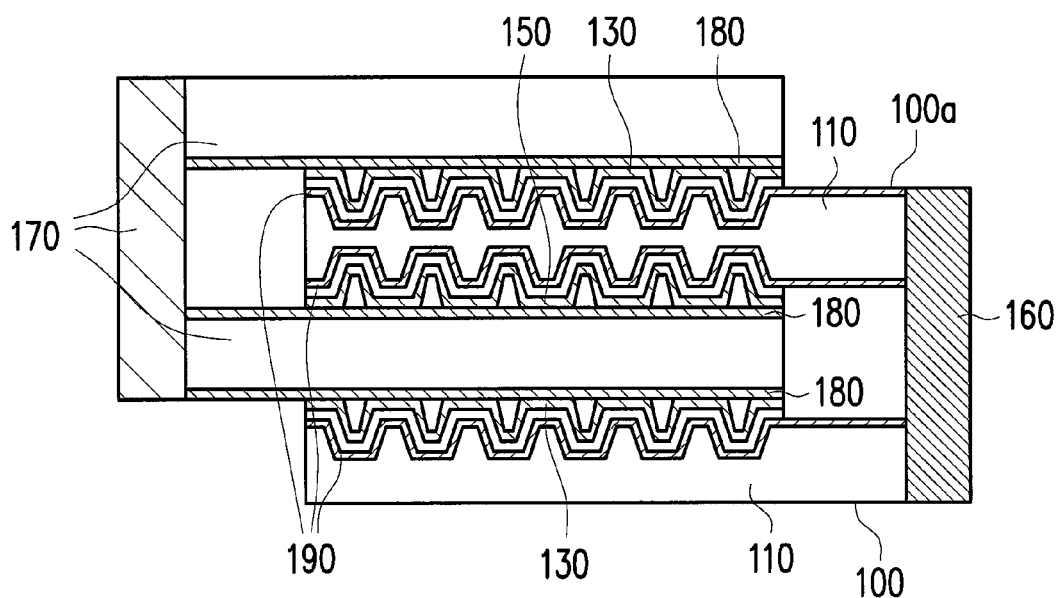

As shown in FIG. 8, a stack-type capacitor structure 10e according to an embodiment of the invention, which is similar to the stack-type capacitor structure 10b of FIG. 5, further includes at least one second conductive layer 190 of the conductive substrate 110. According to the embodiment, the conductive substrate 110 includes the second conductive layers 190 that respectively cover the first surface 112 and/or the second surface 116 and the corresponding first concave 114 and/or the second concave 118 conformally. In addition, the second conductive layers 190 are respectively located between the conductive substrate 110 and the corresponding dielectric layers 120 and 140, and the second conductive layers 190 of the conductive substrate 110 and the corresponding metal layers 130 and 150 are respectively connected with different connection elements. For example, as shown in FIG. 8, the second conductive layers 190 of the conductive substrate 110 are electrically connected with the first connection element 160, and the corresponding first metal layer 130 and second metal layer 150 are electrically connected with the second connection element 170 respectively. Accordingly, the capacitance may still be generated between a conductive layers 190 of the conductive substrate 110 and the corresponding metal layers 130/150, which are electrically connected with the corresponding connection elements 160/170. Therefore, the material of a conductive substrate 110 according to the embodiments may comprise general silicon substrate or other suitable substrate which is cheaper than low-resistance silicon substrate or metal substrate, and the production cost of the embodiments may be further reduced according to the invention.

According to the embodiments of the invention described above, the stack-type capacitor structures 10, 10a, 10b, 10c, 10d, and 10e can have higher integration and higher capacitance by accumulating the capacitance of the capacitor structures 100 and 100a through parallel connection of the capacitor structures 100 and 100a. Additionally, because the conductive substrates 110 and the metal layers 130 and 150 of the stack-type capacitor structures 10, 10a, 10b, 10c, 10d, and 10e have multiple corresponding concaves, which increase the surface area, the capacitance of the stack-type capacitor structures 10, 10a, 10b, 10c, 10d, and 10e are further increased. Furthermore, when the capacitance of stack-type the capacitor structures 10, 10a, 10b, 10c, 10d, and 10e are increased, the sizes of the stack-type capacitor structures 10, 10a, 10b, 10c, 10d, and 10e may be reduced. According to the embodiments of the invention, the lengths of the stack-type capacitor structures 10, 10a, 10b, 10c, 10d, and 10e in a longitudinal direction and/or a transverse direction of the conductive substrate 110 may range from 0.1 cm to 1.5 cm.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. A capacitor structure, comprising:
   a conductive substrate comprising a first surface, a second surface opposite to the first surface, at least one first concave located on the first surface and at least one second concave located on the second surface;
   a first dielectric layer covering the first surface and the first concave;
   a first metal layer covering the first dielectric layer, wherein the first dielectric layer and the first metal layer respectively have concave structures corresponding to the first concave;
   a second dielectric layer covering the second surface and the second concave; and
   a second metal layer covering the second dielectric layer, wherein the second dielectric layer and the second metal layer respectively have concave structures corresponding to the second concave.

2. The capacitor structure according to claim 1, wherein the number of the first concave is two or more.

3. The capacitor structure according to claim 1, wherein the first concave is substantially aligned with the second concave.

4. The capacitor structure according to claim 1, wherein the first concave is not substantially aligned with the second concave.

5. The capacitor structure according to claim 1, wherein the material of the conductive substrate comprises a semiconductor or metal.

6. A stack-type capacitor structure, comprising at least two capacitor structures as recited claim 1, wherein the capacitor structures are stacked and electrically connected in parallel with each other, and at least one cavity exists between any two adjacent capacitor structures.

7. The stack-type capacitor structure according to claim 6, wherein a length of the stack-type capacitor structure in a longitudinal direction of the conductive substrate substantially ranges from 0.1 cm to 1.5 cm.

8. The stack-type capacitor structure according to claim 6, wherein a length of the stack-type capacitor structure in a transverse direction of the conductive substrate substantially ranges from 0.1 cm to 1.5 cm.

9. The stack-type capacitor structure according to claim 6, further comprising a first connection element and a second connection element, wherein the conductive substrate and the first metal layer of the capacitor structure are electrically connected with the first connection element and the second connection element respectively.

10. The stack-type capacitor structure according to claim 6, further comprising a first connection element and a second connection element, wherein any two of the adjacent conductive substrates are electrically connected with the first connection element and the second connection element respectively.

11. The stack-type capacitor structure according to claim 6, wherein at least one of the capacitor structures further comprises:
   a second dielectric layer, wherein the conductive substrate further comprises a second surface opposite to the first surface and at least one second concave located on the second surface, and the second dielectric layer covers the second surface and the second concave; and
   a second metal layer covering the second dielectric layer, wherein the second dielectric layer and the second metal layer respectively have concave structures corresponding to the second concave.

12. The stack-type capacitor structure according to claim 11, wherein the first concave of the capacitor structure that comprises the second concave is substantially aligned with the second concave.

13. The stack-type capacitor structure according to claim 11, wherein the first concave of the capacitor structure that comprises the second concave is not substantially aligned with the second concave.

14. The stack-type capacitor structure according to claim 11, further comprising a first connection element and a second connection element, wherein one of the conductive substrates is electrically connected with the first connection element, and the corresponding first metal layer and/or second metal layer are electrically connected with the second connection element.

15. A stack-type capacitor structure, comprising at least two capacitor structures, wherein each of the capacitor structures comprises:
   a conductive substrate comprising a first surface and at least one first concave located on the first surface;
   a first dielectric layer covering the first surface and the first concave; and
   a first metal layer covering the first dielectric layer, wherein the first dielectric layer and the first metal layer respectively have concave structures corresponding to the first concave,
   wherein the at least two capacitor structures are stacked and electrically connected in parallel with each other, and at least one cavity exists between any two adjacent capacitor structures.

16. The stack-type capacitor structure according to claim 15, wherein a length of the stack-type capacitor structure in a longitudinal direction of the conductive substrate substantially ranges from 0.1 cm to 1.5 cm.

17. The stack-type capacitor structure according to claim 15, wherein a length of the stack-type capacitor structure in a transverse direction of the conductive substrate substantially ranges from 0.1 cm to 1.5 cm.

18. The stack-type capacitor structure according to claim 15, further comprising a first connection element and a second connection element, wherein the conductive substrate and the first metal layer of the capacitor structure are electrically connected with the first connection element and the second connection element respectively.

19. The stack-type capacitor structure according to claim 15, further comprising a first connection element and a second connection element, wherein any two of the adjacent conductive substrates are electrically connected with the first connection element and the second connection element respectively.

* * * * *